(12) United States Patent
Park et al.

(10) Patent No.: US 7,566,596 B2
(45) Date of Patent: *Jul. 28, 2009

(54) METHOD OF MANUFACTURING A THIN FILM TRANSISTOR SUBSTRATE AND STRIPPING COMPOSITION

(75) Inventors: Hong-Sik Park, Suwon-si (KR); Shi-Yul Kim, Yongin-si (KR); Jong-Hyun Choung, Suwon-si (KR); Won-Suk Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 27 days.

This patent is subject to a terminal disclaimer.

(21) Appl. No.: 11/875,028

(22) Filed: Oct. 19, 2007

(65) Prior Publication Data

US 2008/0096333 A1 Apr. 24, 2008

Related U.S. Application Data

(63) Continuation of application No. 11/215,140, filed on Aug. 30, 2005, now Pat. No. 7,300,827.

(30) Foreign Application Priority Data

Aug. 30, 2004 (KR) .............................. 2004-68791
May 25, 2005 (KR) .............................. 2005-44153

(51) Int. Cl.
*H01L 21/00* (2006.01)
*H01L 21/84* (2006.01)

(52) U.S. Cl. .................. 438/149; 438/197; 438/706; 438/733; 438/745; 257/E21.051; 257/E21.229; 257/E21.245

(58) Field of Classification Search ................. 438/149, 438/197, 30, 96, 257, 258, 259, 688, 706, 438/733, 745
See application file for complete search history.

(56) References Cited

U.S. PATENT DOCUMENTS

| | | | |
|---|---|---|---|
| 5,986,729 A * | 11/1999 | Yamanaka et al. ............ 349/79 |
| 6,924,865 B2 | 8/2005 | Ohta et al. |
| 7,042,545 B2 | 5/2006 | Byun et al. |
| 7,300,827 B2 * | 11/2007 | Park et al. ................... 438/149 |
| 2005/0078233 A1 | 4/2005 | Lim et al. |
| 2006/0269849 A1 | 11/2006 | Lee |
| 2007/0020910 A1 | 1/2007 | Park et al. |
| 2007/0082432 A1 | 4/2007 | Lee |
| 2008/0039354 A1 * | 2/2008 | Park et al. ................... 510/176 |

* cited by examiner

*Primary Examiner*—David Nhu
(74) *Attorney, Agent, or Firm*—Cantor Colburn LLP

(57) ABSTRACT

A method of manufacturing a thin film transistor substrate includes forming a transistor thin layer pattern, forming a protecting layer, forming a photoresist film, forming a pixel electrode and a conductive layer that are separated from each other, stripping a photoresist pattern to remove the conductive layer using a stripping composition and dissolving the conductive layer. The method of manufacturing a thin film transistor substrate is capable of improving an efficiency of manufacturing process of the thin film transistor substrate. In addition, the stripping composition is recycled.

14 Claims, 9 Drawing Sheets

METHOD OF MANUFACTURING A THIN FILM TRANSISTOR SUBSTRATE AND STRIPPING COMPOSITION

CROSS REFERENCE TO RELATED APPLICATIONS

This application is a continuation application of U.S. application Ser. No. 11/215,140 filed on Aug. 30, 2005 and issued as U.S. Pat. No. 7,300,827 on Nov. 27, 2007, which claims priority to Korean Patent Application No. 2004-68791 filed on Aug. 30, 2004, and Korean Patent Application No. 2005-44153 filed on May 25, 2005, and all the benefits accruing therefrom under 35 U.S.C. §119 the contents of which are herein incorporated by reference in their entireties.

BACKGROUND OF THE INVENTION

1. Field of the Invention

The present invention relates to a method of manufacturing a thin film transistor substrate and a stripping composition. More particularly, the present invention relates to a method of manufacturing a thin film transistor substrate capable of simplifying a manufacturing process of the thin film transistor substrate and a stripping composition employed for the manufacturing process of the thin film transistor substrate.

2. Description of the Related Art

In general, a display device includes a cathode ray tube type (CRT) display (CRT) device, a liquid crystal display (LCD) device, a plasma display panel (PDP) device, and an organic light emitting display (OLED) device.

Most of the display devices, except for the CRT device, include a thin film transistor substrate having a thin film transistor so as to display images.

In order to simplify the manufacturing process of the thin film transistor substrate to reduce a manufacturing cost, novel technologies have been rapidly developed.

SUMMARY OF THE INVENTION

The present invention provides an exemplary embodiment of a method of manufacturing a thin film transistor substrate capable of simplifying a manufacturing process of the thin film transistor substrate.

The present invention also provides an exemplary embodiment of a stripping composition that is used for the manufacturing process of the thin film transistor and is reusable.

In exemplary embodiments of a method of manufacturing a thin film transistor substrate, a transistor thin layer pattern is disposed on a substrate. A protecting layer is disposed on the transistor thin layer pattern. A photoresist film is disposed on the protecting layer. The photoresist film forms a photoresist pattern on the substrate by a photolithography process. An undercut is generated at a lower portion of the photoresist pattern by the photolithography process. A pixel area is formed on a portion of the substrate by removing the photoresist film. A conductive material is deposited on the photoresist pattern. The conductive material is deposited on the photoresist pattern to form a conductive layer, and the conductive material is deposited on the pixel area to form a pixel electrode. A stripping composition is applied onto the pixel electrode and the photoresist pattern to strip the photoresist pattern, so that the conductive layer is separated from the substrate. A used stripping composition containing the conductive layer separated from the substrate is collected and stored in a storage tank. The conductive layer separated from the substrate is completely dissolved in the used stripping composition.

In another exemplary embodiment, the stripping composition includes both a stripping agent for stripping the photoresist and a stripping additive for dissolving the conductive layer.

In another exemplary embodiment, a stripping composition includes a stripping agent for stripping a photoresist and a stripping additive for stripping a conductive layer. The stripping agent for stripping the photoresist includes about 20 percent by weight to about 40 percent by weight of an amine-based compound, about 20 percent by weight to about 50 percent by weight of a protonated glycol-based compound and about 20 percent by weight to about 40 percent by weight of a deprotonated multipolar compound. The stripping additive for stripping the conductive layer includes about 0.5 percent by weight to about 3 percent by weight of a thiol-based compound.

In another exemplary embodiment, the thiol-based compound may include a thio benzoic acid or thiol acid.

In another exemplary embodiment of the method of manufacturing a thin film transistor substrate, the number of masks may decrease, so that the manufacturing process of the thin film transistor may be simplified. Additionally, the stripping composition used for manufacturing the thin film transistor substrate may dissolve the photoresist film, and furthermore the stripping composition may completely dissolve the conductive layer after the photoresist film is dissolved. Advantageously, the stripping composition according to the present invention may be recycled.

In another exemplary embodiment of the method of manufacturing a thin film transistor substrate, a gate line and gate electrode are formed on the substrate substantially perpendicular to each other. A gate insulating layer is formed on the substrate covering the gate line and gate electrode. An amorphous silicon pattern and an $n^+$ amorphous silicon pattern are formed on the gate insulating layer. A date line, source electrode and drain electrode are formed on the substrate. The source electrode and the drain electrode are electrically connected to the $n^+$ amorphous silicon pattern. The forming of the gate line, the gate electrode, the amorphouse silicon pattern, the $n^+$ amorphous silicon pattern, the date line, the source electrode and the drain electrode uses multiple masks.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
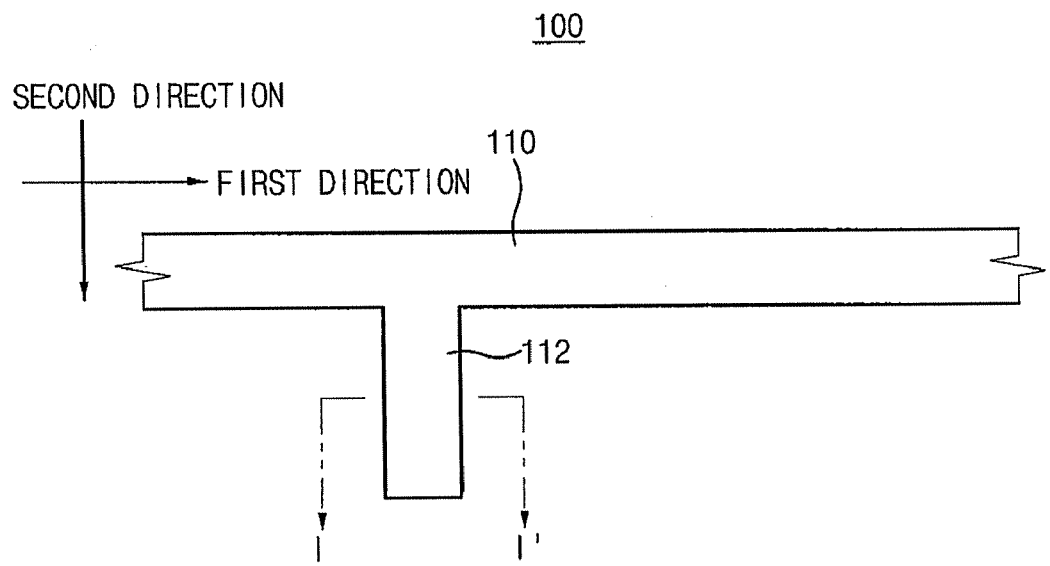
FIG. 1 is a plan view illustrating an exemplary embodiment of a gate line formed on a substrate by an exemplary embodiment of a method of manufacturing a thin film transistor substrate according to the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
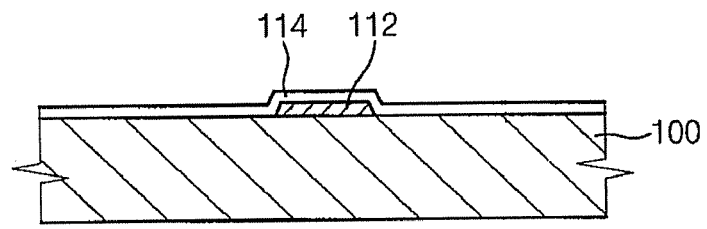
FIG. 2 is a cross-sectional view taken along line I-I' in FIG. 1.

An Exemplary Embodiment of a Method of Manufacturing a Thin Film Transistor Substrate FIG. 1 is a plan view of an exemplary embodiment of a gate line formed on a substrate by an exemplary embodiment of a method of manufacturing a thin film transistor substrate according to an embodiment of the present invention. FIG. 2 is a cross-sectional view of an exemplary embodiment of the gate line taken along line I-I' in FIG. 1.

Referring to FIGS. 1 and 2, a gate line 110 is formed on a substrate 100 along a first direction, and a gate electrode 112 is formed on the gate line 110 extended along a second direction substantially perpendicular to the first direction. In exemplary embodiments, a conductive gate thin layer entirely formed on the substrate 100 is patterned using a mask to form the gate line 110 and the gate electrode 112. In alternative embodiments, the conductive gate thin layer may include, but is not limited to, aluminum, an aluminum alloy, and the like, as well as combinations including at least one of the foregoing.

A gate insulating layer 114 may be formed on the substrate 100 to cover the gate line 110 and the gate electrode 112 as shown in the exemplary embodiment of FIG. 2.

Figure 3:
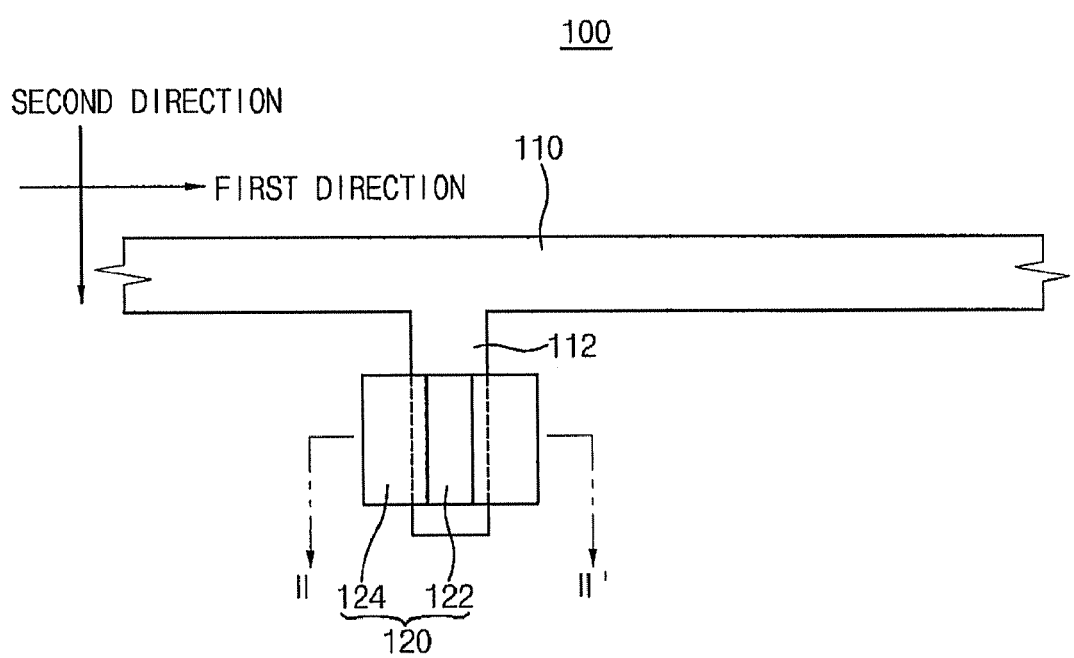
FIG. 3 is a plan view of an exemplary embodiment of a channel layer formed on the exemplary embodiment of the gate line in FIG. 1.
Figure 4:
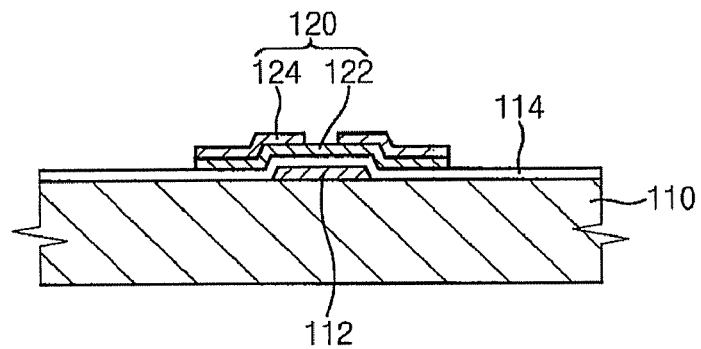
FIG. 4 is a cross-sectional view taken along line II-II' in FIG. 3.

FIG. 3 is a plan view of an exemplary embodiment of a channel layer formed on the gate line in FIG. 1. FIG. 4 is a cross-sectional view taken along line II-II' in FIG. 3.

Referring to FIGS. 3 and 4, an amorphous silicon thin layer and an n+ amorphous silicon thin layer 120 may be sequentially formed on an upper face of the gate insulating layer 114. The amorphous silicon thin layer and the n+ amorphous silicon thin layer 120 may be patterned by a photolithography process using a mask to form an amorphous silicon pattern 122 and an n+ amorphous silicon pattern 124 on the gate electrode 112. The amorphous silicon pattern 122 may be formed on the gate insulating layer 114 corresponding to the gate electrode 112. A pair of the n+ amorphous silicon pattern 124 may be formed on an upper face of the amorphous silicon pattern 122. In the exemplary embodiment in FIG. 4, the n+ amorphous silicon patterns 124 may be spaced apart from each other.

Figure 5:
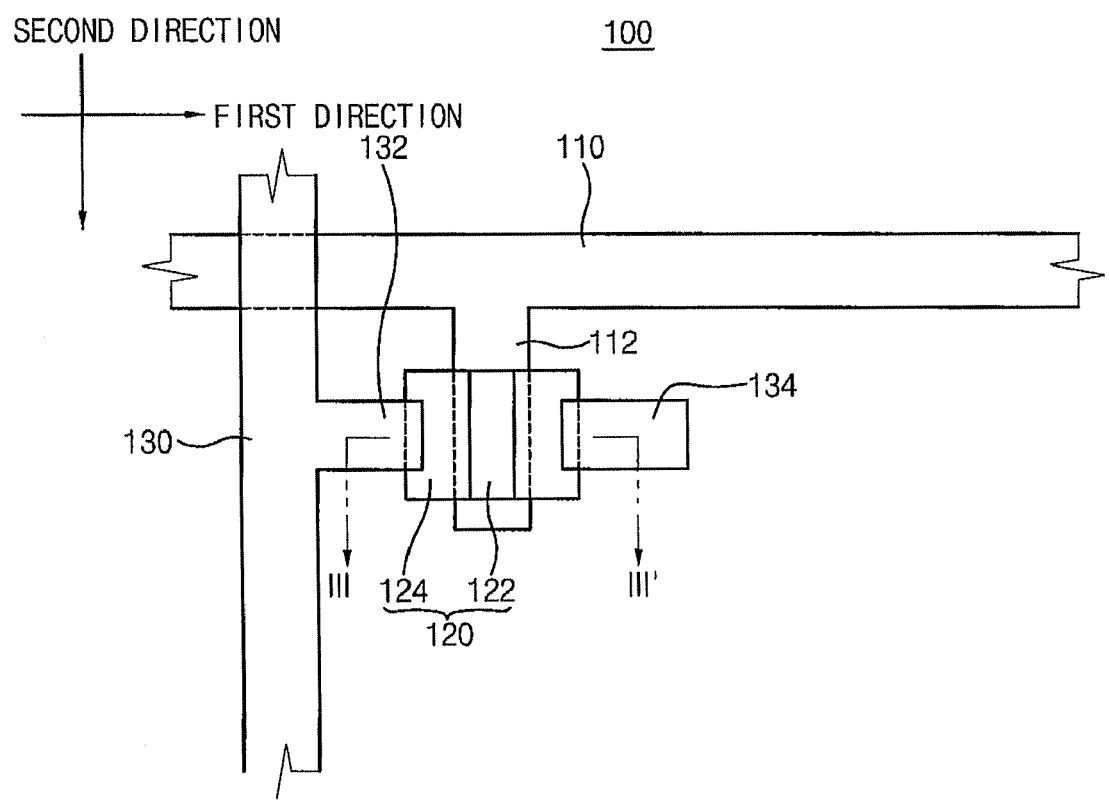
FIG. 5 is a plan view of an exemplary embodiment of source and drain electrodes electrically connected to the exemplary embodiments of an $n^+$ amorphous silicon pattern in FIG. 3.
Figure 6:
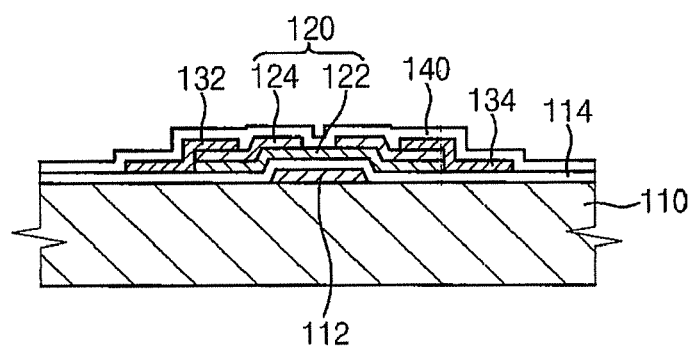
FIG. 6 is a cross-sectional view taken along line III-III' in FIG. 5.

FIG. 5 is a plan view of an exemplary embodiment of source and drain electrodes electrically connected to the n+ amorphous silicon pattern in FIG. 3. FIG. 6 is a cross-sectional view taken along line III-III' in FIG. 5.

Referring to FIGS. 5 and 6, after the amorphous silicon pattern 122 and the n+ amorphous silicon pattern 124 are formed on the substrate 100, a source/drain thin layer may be entirely formed on the substrate 100. In alternative embodiments, the source/drain thin layer may be patterned by the photolithography process using the mask. As a result, a data line 130, a source electrode 132 and a drain electrode 134 may be formed on the substrate 100.

The data line 130 may be extended along the second direction, and the source electrode 132 may be extended from the data line 130 along the first direction as shown in FIG. 5. The data line 130 and the source electrode 132 may be substantially perpendicular to each other.

In exemplary embodiments, the source electrode 132 extended from the data line 130 may be electrically connected to one side of the n+ amorphous silicon pattern 124. In alternative embodiments, the drain electrode 134 may be electrically connected to another side of the n+ amorphous silicon pattern 124.

Referring to FIG. 6, a protecting layer 140 may be formed on the substrate 100 to cover the data line 130, the source electrode 132 and the drain electrode 134.

As described above, the gate line 110, the gate electrode 112, the n+ amorphous silicon pattern 124, the amorphous silicon pattern 122, the data line 130, the source electrode 132 and the drain electrode 134 may bw formed on the substrate 100 using multiplemasks. In alternative embodiments, the gate line 110 and the gate electrode 112 may be formed using one mask. In other alternative embodiments, the n+ amorphous silicon pattern 124, the amorphous silicon pattern 122, the data line 130, the source electrode 132 and the drain electrode 134 may be formed using one mask.

Figure 7:
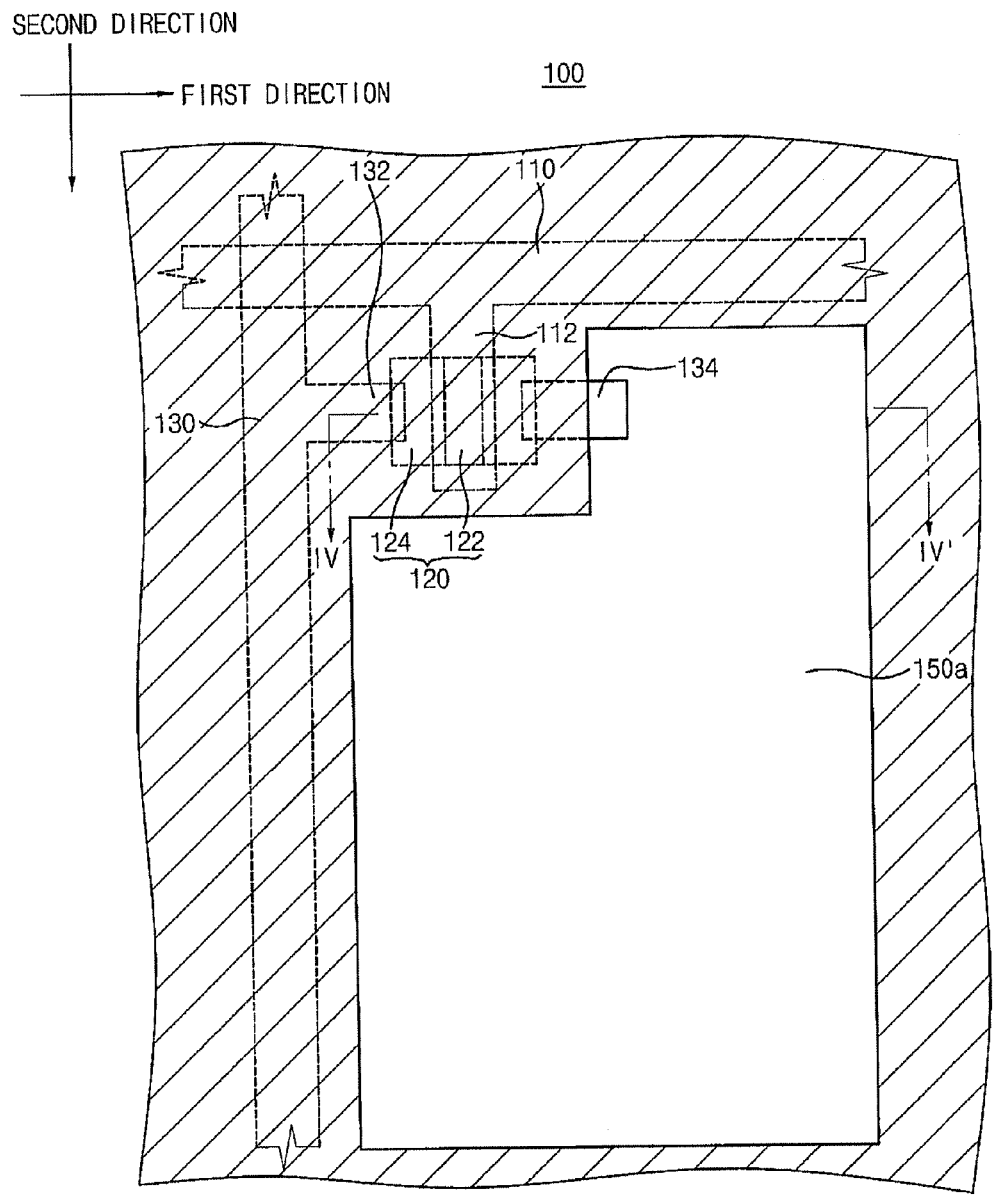
FIG. 7 is a plan view of an exemplary embodiment of a photoresist pattern formed on an exemplary embodiment of a protecting layer.
Figure 8:
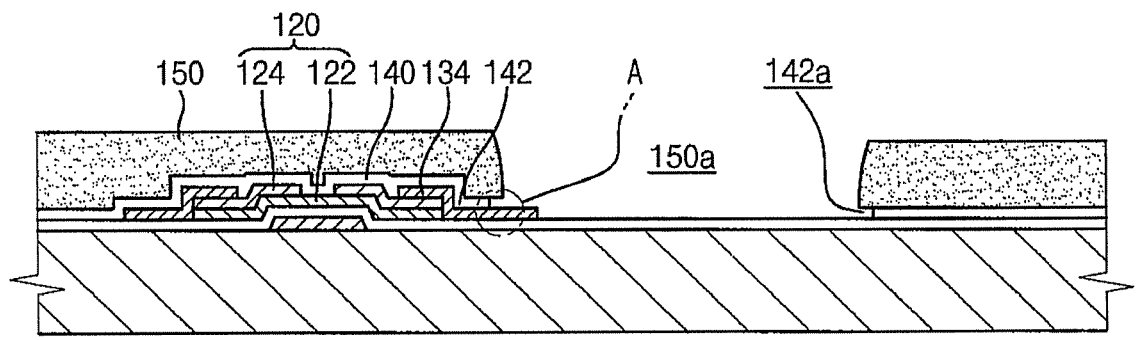
FIG. 8 is a cross-sectional view taken along line IV-IV' in FIG. 7.
Figure 9:
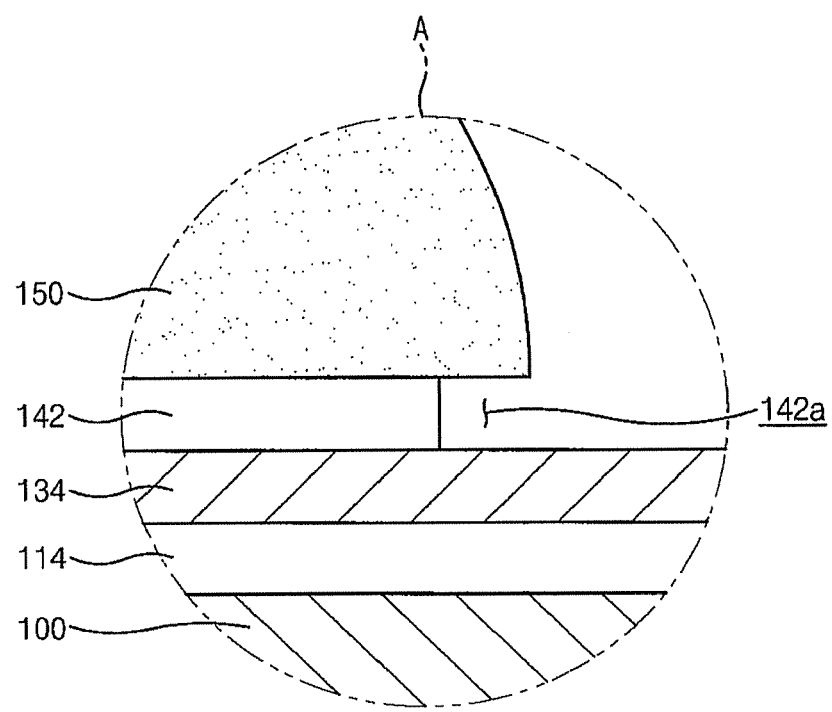
FIG. 9 is an enlarged view of an exemplary embodiment of portion 'A' in FIG. 8.

FIG. 7 is a plan view of an exemplary embodiment of a photoresist pattern formed on a protecting layer. FIG. 8 is a cross-sectional view taken along line IV-IV' in FIG. 7. FIG. 9 is an enlarged view illustrating an exemplary embodiment of portion 'A' in FIG. 8.

Referring to FIGS. 7 through 9, the photoresist thin layer is entirely formed on the substrate 100. The photoresist thin layer may be patterned using the mask to form a photoresist pattern 150 on an upper face of the substrate 100. Reference number 150a in FIGS. 7 and 8 indicates a pixel area that may be exposed through an area from which the photoresist pattern 150 is removed.

The protecting layer 140 may be patterned using a photoresist pattern 150 as the mask to form a protecting pattern 142 on the substrate 100. In exemplary embodiments, when the protecting pattern 142 is partially opened or entirely removed, the drain electrode 134 covered by the protecting layer 140 may be exposed as shown in FIG. 8.

When the protecting layer 140 is patterned using the photoresist pattern 150 as the mask, the protecting layer 140 may be isotropically etched by a wet etching. For example, as the protecting layer 140 is isotropically etched by the wet etching, the protecting pattern 142 is more etched than an edge portion of the photoresist pattern 150 to generate an undercut at the protecting pattern 142. As best shown in the enlarged view of portion 'A' in FIG. 9, reference numeral 142a denotes the undercut.

In alternative embodiments, when the protecting layer 140 is patterned using the photoresist pattern 150 as the mask, the protecting layer 140 may be anisotropically etched by a dry etching. For example, after the protecting layer 140 is anisotropically etched by the dry etching, the protecting layer 140 may be isotropically etched by the wet etching to generate the undercut 142a at the protecting pattern 142.

Figure 10:
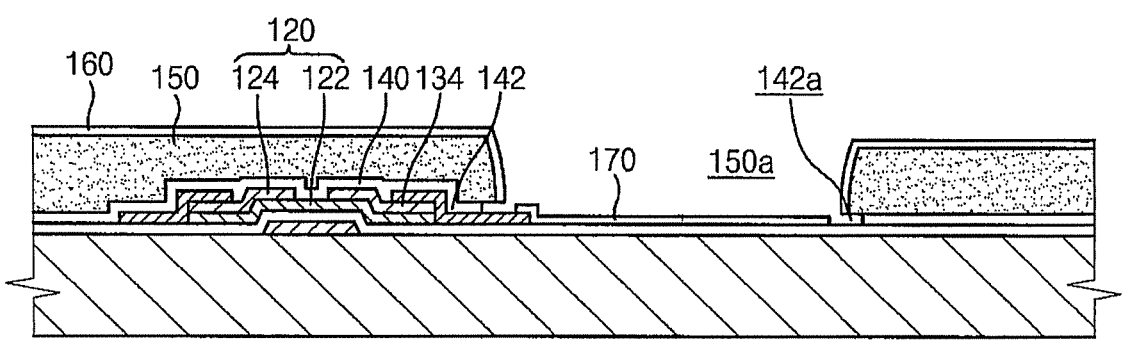
FIG. 10 is a cross-sectional view of an exemplary embodiment of a transparent conductive thin layer formed on the exemplary embodiment of a substrate in FIG. 9.

FIG. 10 is a cross-sectional view of an exemplary embodiment of a transparent conductive thin layer formed on the substrate in FIG. 9.

Referring to FIG. 10, a transparent conductive material is deposited on the substrate 100. The transparent conductive material may include, but is not limited to, indium zinc oxide (IZO). In alternative embodiments, the transparent conductive material may include amorphous indium tin oxide (a-ITO), indium tin oxide (ITO), and the like, as well as combinations including at least one of the foregoing.

In exemplary embodiments, as the transparent conductive material is formed on the substrate 100, a conductive layer 160 may be formed on the photoresist pattern 150. As shown in the exemplary embodiment of FIG. 10, a pixel electrode 170 is formed on the gate insulating layer 114, and the pixel electrode 170 is electrically separated from the conductive layer 160 since the undercut 142a is formed between the conductive layer 160 and the pixel electrode 170.

Figure 11:
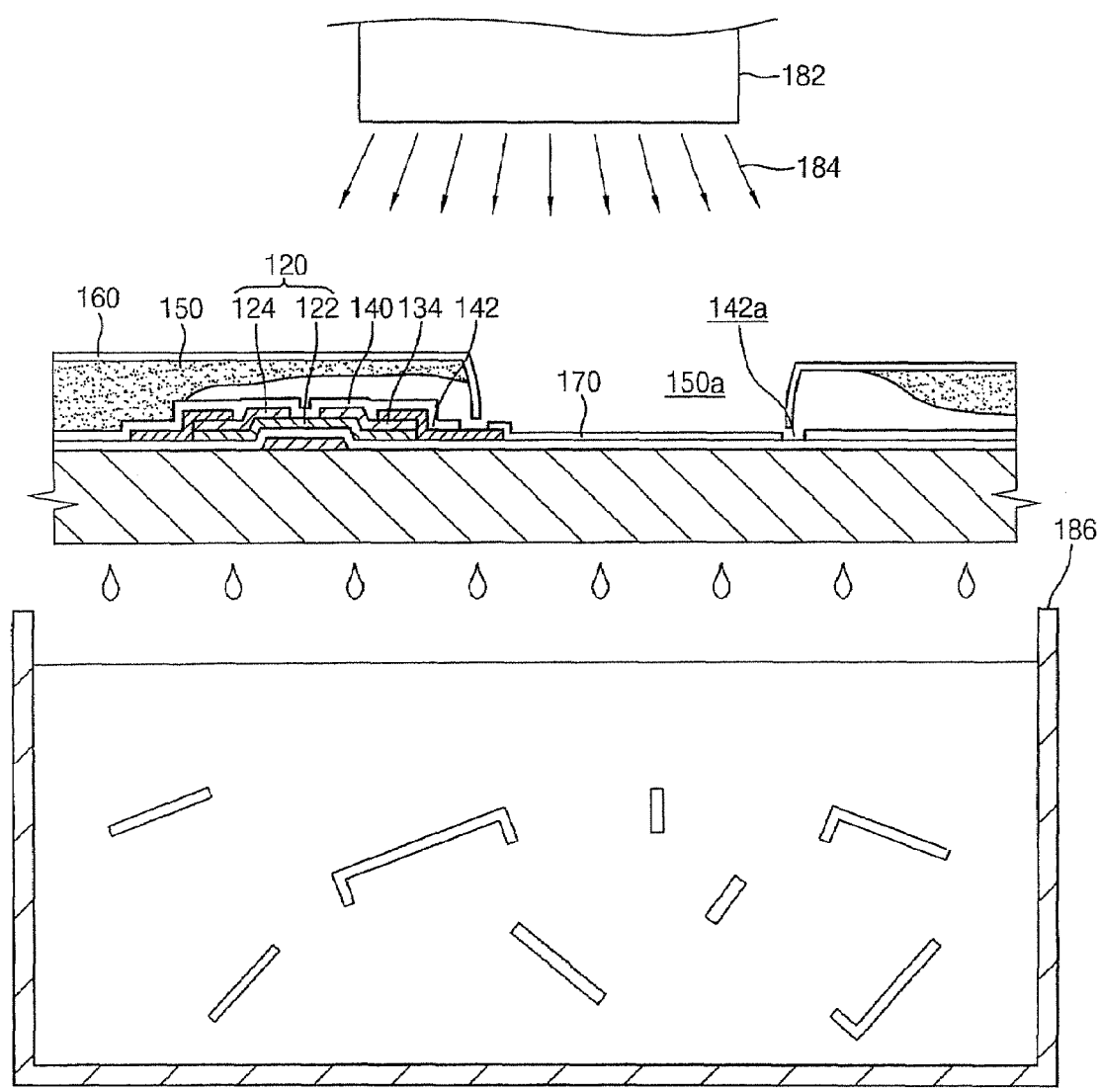
FIG. 11 is a cross-sectional view of an exemplary embodiment of the substrate in FIG. 10 with a part of a photoresist pattern and a conductive layer removed according to an exemplary method of an embodiment of the invention.

FIG. 11 is a cross-sectional view of an exemplary embodiment of the substrate in FIG. 10 with a part of a photoresist pattern and a conductive layer removed.

Referring to FIG. 11, after the conductive layer 160 and the pixel electrode 170 are formed on the substrate 100, a stripping composition 184 may bes sprayed on the substrate 100 through, for example, a dispenser 182.

In exemplary embodiments, the stripping composition 184 may include a stripping agent for the photoresist layer and a stripping additive for the conductive layer. For example, the stripping agent for the photoresist layer may react with the photoresist pattern 150 to remove the photoresist pattern 150. In alternative embodiments, the stripping additive for the conductive layer may etch the conductive layer 160.

The stripping composition may include as the stripping agent for the photoresist layer, an amine-based compound, a protonated glycol-based compound, a deprotonated multipolar compound, and the like, as well as any combination including at least one of the fore going. The stripping additive for the conductive layer may include, but is not limited to a thiol-based compound, an oxalic acid derivative.

The stripping composition will be later described in detail.

In exemplary embodiments, the stripping composition may strip the photoresist pattern 150, remove the conductive layer 160, and etch the pixel electrode 170 since the stripping composition may include the stripping agent for the photoresist layer and the stripping additive for the conductive layer.

Referring to FIG. 11, when the stripping composition 184 is sprayed on the photoresist pattern 150, the conductive layer 160 and the pixel electrode 170 formed on the photoresist pattern 150, even the conductive layer 160 and the pixel electrode 170 may be etched by the stripping composition while the photoresist pattern 150 is stripped.

The photoresist pattern 150 may be primarily stripped, and then the conductive layer 160 and the pixel electrode 170 may be etched. Advantageously, stripping time for stripping the photoresist pattern 150 may be properly controlled.

A required time for removing the conductive layer 160, formed on the photoresist pattern 150, from the substrate 100 by stripping the photoresist pattern 150 using the stripping composition 184 may be defined as a first time. A required time for completely etching the conductive layer 160 and the pixel electrode 170 using the stripping composition 184 is defined as a second time. The first and second times may be defined by a relationship represented by Formula 1.

The first time<The second time    [Formula 1]

The stripping composition 184 is sprayed on the substrate 100 to separate the conductive layer 160 from the substrate 100 within the first time, so that the pixel electrode 170 is essentially prevented from being damaged by the stripping composition 184. In exemplary embodiments, the first time may range from about 2 minutes to about 4 minutes when the stripping composition described above is used. In alternative embodiments, the first time may preferably range from about 2.5 minutes to about 3 minutes.

The parts of the conductive layer 160 separated from the substrate 100 after applying the stripping composition 184 are flowed into a storage tank 186 with residual stripping composition 184. The separated conductive layer 160 that flows into the storage tank 186 with the residual stripping composition 184 may be completely dissolved within the second time. In exemplary embodiments, the second time may range from about 10 minutes to about 30 minutes when the stripping composition 184 described above is used.

In alternative embodiments, when the separated conductive layer 160 is completely dissolved in the storage tank 186, the stripping composition 184 may be recycled to be provided again to the dispenser 182. For example, the stripping composition 184 may be repeatedly used in a follow-up process.

In exemplary embodiments, the photoresist pattern 150 may be stripped at a temperature ranging from about 60° C. to about 80° C., and the conductive layer 160 may be dissolved at a temperature ranging from about 60° C. to about 80° C.

Figure 12:
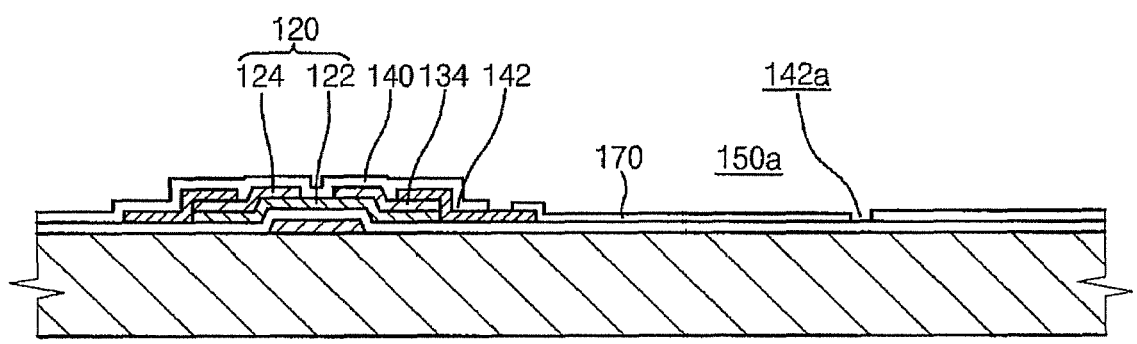
FIG. 12 is a cross-sectional view of an exemplary embodiment of a thin film substrate in FIG. 11 without the photoresist pattern and the conductive layer.

FIG. 12 is a cross-sectional view of an exemplary embodiment of a thin film substrate without the photoresist pattern and the conductive layer in FIG. 11.

Referring to FIG. 12, the photoresist pattern 150 may be stripped by the stripping composition 184, and parts of the conductive layer 160 may be separated from the substrate 100 to be flowed into the storage tank 186. Advantageously, a thin film transistor and the pixel electrode 170 remain on the substrate 100. In exemplary embodiments, the substrate 100 may be preferably cleaned to effectively prevent the pixel electrode 170 from being damaged by the stripping composition 184 remaining on the substrate 100.

An Exemplary Embodiment of a Stripping Composition

An exemplary embodiment of a stripping composition will be described in detail hereinafter.

As discussed earlier, the stripping composition may include a stripping agent for a photoresist layer and a stripping additive for a conductive layer. In exemplary embodiments, the stripping agent for the photoresist layer may strip a photoresist pattern, and the stripping additive for the conductive layer may etch the conductive layer. The stripping agent for the photoresist layer may include an amine-based compound, a protonated glycol-based compound, a deprotonated multipolar compound and the like, as well as any combination including at least one of the foregoing. The stripping additive for the conductive layer may include a thiol-based compound.

Examples of the amine-based compound may include, but are not limited to, mono ethanol amine, mono isopropanol amine, methylmethanol amine, ethylethanol amine, dimethanol amine, aminoethoxyethanol amine and the like. These compounds may be used alone or in a mixture thereof.

In exemplary embodiments, when a content of the amine-based compound is less than about 20 percent by weight, the photoresist pattern may not be sufficiently stripped in a period of time. In other exemplary embodiments, when the content of the amine-based compound exceeds about 40 percent by weight, a pixel electrode may be excessively etched and/or be damaged while the photoresist pattern is stripped. Further, when the content of the amine-based compound exceeds about 40 percent by weight, an amount of evaporated stripping composition 184 may increase to change the contents of components in the stripping composition 184.

In alternative embodiments, where the photoresist pattern may be sufficiently stripped and/or the pixel electrode may not be excessively etched or damaged, the content of the stripping composition ranges from about 20 percent by weight to about 40 percent by weight. In other alternative embodiments, the content of the stripping composition may preferably range from about 25 percent by weight to about 35 percent by weight.

Examples of the protonated glycol-based compound may include, but are not limited to, butyldiglycol, diethyleneglycol methylether, diethyleneglycol ethylether, diethyleneglycol propylether, diethyleneglycol butylether, ethyleneglycol, and the like. These compounds may be used alone or in a mixture thereof.

In exemplary embodiments, when a content of the protonated glycol-based compound is less than about 20 percent by weight, dissolution of the photoresist layer may excessively decrease. In other exemplary embodiments, when the content of the protonated glycol-based compound exceeds about 50 percent by weight, sediment may be generated. In alternative embodiments where the photoresist layer dissolution may not essentially decrease excessively and/or no sediment may effectively generated, the content of the protonated glycol-based compound may range from about 20 percent by weight to about 50 percent by weight.

Examples of the deprotonated multipolar compound may include, but are not limited to, N-methyl-2-pyrrolidone, N,N-dimethyl acetamide, N,N-dimethyl formamide, N,N-dimethyl imidazole, and the like. These compounds may be used alone or in a mixture thereof.

In exemplary embodiments, when a content of the deprotonated multipolar compound is less than about 20 percent by weight, stripping time of the photoresist pattern may increase, thereby inducing a damage of the conductive layer. Here, the damage may be caused by thiol-based compound. In other exemplary embodiments, when the content of the depronated multipolar compound exceeds about 40 percent by weight, the conductive layer may be etched while etching the photoresist pattern. In alternative embodiments, when the stripping time of the photoresist pattern may not effectively increase and/or the conductive layer may be essentially undamaged and/or unetched, the content of the deprotonated multipolar compound may range from about 20 percent by weight to about 40 percent by weight. In alternative embodiments, the content of the deprotonated multipolar compound may preferably range from about 25 percent by weight to about 35 percent by weight.

In alternative embodiments, the stripping additive may include a thiol-based compound or an oxalic acid derivative. In other alternative embodiments, the thiol-based compound may preferable to the oxalic acid derivative. Examples of the thiol-based compound may include, but are not limited to, a thiobenzoic acid, thiol acid, and the like. These compounds may be used alone or in a mixture thereof.

In exemplary embodiments, when a content of the thiol-based compound is less than about 0.5 percent by weight, the conductive layer may not be completely dissolved in the stripping composition, such that recycling of the stripping composition may be difficult. In other exemplary embodiments, when the content of the thiol-based compound exceeds about 3 percent by weight, sediment may be generated in the stripping composition. In alternative embodiments, the content of the thiol-based compound may range from about 0.5 percent by weight to about 3 percent by weight. In other alternative embodiments, when the conductive layer lay essentially be dissolved and/or no sediment is effectively generated, the content of the thiol-based compound may preferably range from about 1.5 percent by weight to about 2 percents by weight.

Hereinafter, an exemplary embodiment of the present invention is described in detail with reference to the following examples. The examples are given solely for the purpose of illustration and are not to be construed as limitations of the present invention, as many variations thereof are possible without departing from the spirit and scope of the invention.

EXAMPLES 1 to 3

About 100 ml of a stripping composition was acquired according to a composition of Table 1.

TABLE 1

| | Composition (percents by weight) | | | | |
|---|---|---|---|---|---|
| | Amine-based compound | Protonated glycol-based compound | | Deprotonated multipolar compound | Thiol-based compound |
| Example | Monoeth-anol amine | Butyldi-glycol | Ethylene-glycol | N-methyl-2-pyrrolidone | Thiol acid |
| Example 1 | 30 | 25 | 14 | 30 | 1 |
| Example 2 | 30 | 25 | 13.5 | 30 | 1.5 |
| Example 3 | 30 | 25 | 13 | 30 | 2 |

Experiment 1: Estimation of Solvating Power of an IZO Conductive Layer

Each of the stripping compositions of Examples 1, 2 and 3 was heated to a temperature of about 70° C., and then the heated stripping compositions were added to an indium zinc oxide (IZO) layer (550 Å) and kept for about 30 minutes. Then, dissolution of the conductive layer was observed.

Figure 13A:
FIG. 13A is a picture of a surface of a conductive layer dissolved by an exemplary embodiment of a stripping composition of Example 1.
Figure 13B:
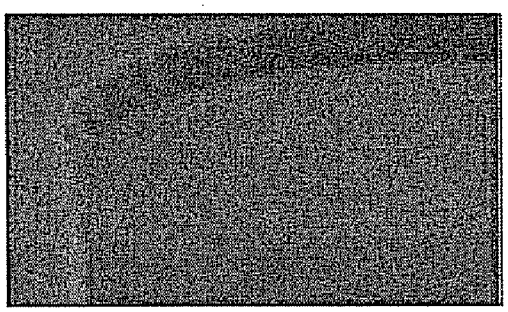
FIG. 13B is a picture of a surface of a conductive layer dissolved by an exemplary embodiment of a stripping composition of Example 2.
Figure 13C:
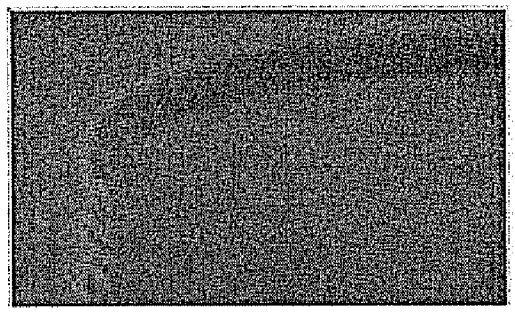
FIG. 13C is a picture of a surface of a conductive layer dissolved by an exemplary embodiment of a stripping composition of Example 3.

FIG. 13A is a picture of a surface of the conductive layer dissolved by an exemplary embodiment of a stripping composition of Example 1. FIG. 13B is a picture of a surface of the conductive layer dissolved by an exemplary embodiment of a stripping composition of Example 2. FIG. 13C is a picture of a surface of the conductive layer dissolved by an exemplary embodiment of a stripping composition of Example 3.

Referring to FIGS. 13A to 13C, the IZO layer is shown completely dissolved within about 30 minutes of the addition of the heated stripping compounds. Advantageously, the stripping composition may completely dissolve the conductive layer within about 30 minutes of a processing time.

Experiment 2: Measuring an Eluted Amount of Indium and Zinc

Each of the stripping compositions of Examples 1 and 3 was sprayed on the thin film transistor substrate after the photoresist pattern was completely stripped. Eluted amounts of indium and zinc were respectively measured. Results are shown in Table 2. The stripping composition of Example 3 was sprayed on the thin film transistor substrate before the photoresist pattern was stripped, then the eluted amounts of indium and zinc were respectively measured. Results are shown in Table 3.

TABLE 2

| | | After PR stripping | | |
|---|---|---|---|---|
| Metal | Example | 3 minutes (ppb) | 10 minutes (ppb) | 30 minutes (ppb) |
| Indium | Example 1 | 16.2 | 68.9 | 230.1 |
| | Example 3 | 20.7 | 95.2 | 291.5 |
| Zinc | Example 1 | 2.4 | 4.6 | 9.8 |
| | Example 3 | 3.4 | 4.2 | 15.7 |

TABLE 3

| | | Before PR stripping | | |
|---|---|---|---|---|
| Metal | Example | 3 minutes (ppb) | 10 minutes (ppb) | 30 minutes (ppb) |
| Indium | Example 3 | 125.2 | 206.8 | 358.2 |
| Zinc | Example 3 | 11.9 | 16.4 | 20.7 |

Referring to Tables 3 and 4, the eluted amount of the metal after PR stripping shows a difference of about 100 ppb with respect to the eluted amount of the metal before PR stripping. Advantageously, the conductive layer on the photoresist pattern is removed during the PR stripping.

Experiment 3: Variation of Content of Amine

About 1000 ml of PR stripper (commercially available as a trade name of PRS-2000, manufactured by Dong-woo finechem Co., Korea) as a Comparative Example and about 1000 ml of the stripping composition of Example 2 were exhausted by forced exhaust (FE) type. Variation of the content of amine was measured during the exhausting process. Results are shown in Table 4.

TABLE 4

| | 10 minutes (ml) | 20 minutes (ml) | 30 minutes (ml) | 40 minutes (ml) |
|---|---|---|---|---|
| Comparative Example | 10 | 20 | 30 | 40.5 |
| Example 4 | 7 | 10.5 | 14 | 15 |

Referring to Table 4, variation of the content of amine in the stripping composition of Example 4 was lower than variation of the content of amine in the stripper of Comparative Example. Advantageously, the stripping composition according to an exemplary embodiment of the present invention may have an excellent stability.

As discussed above, the exemplary embodiments of a method of manufacturing a thin film transistor substrate may improve an efficiency of manufacturing process for the thin film transistor substrate.

Further, the exemplary embodiments of the stripping composition used for the manufacturing process of thin film transistor substrate discussed above, may dissolve the photoresist and/or the conductive layer. Advantageously, solid components may not remain in the used stripping composition, such that the used stripping composition may be recycled and reused in the process of manufacturing the follow-up thin film transistor substrate. As a further advantage, the stripping composition may have the excellent stability.

What is claimed is:

1. A method of manufacturing a thin film transistor substrate comprising:
    forming a gate line and a gate electrode on a substrate;
    forming a gate insulating layer and an active layer on the gate line and the gate electrode;
    forming an active pattern;
    forming a data line, a source electrode and a drain electrode on the substrate, the forming a data line, a source electrode and a drain electrode including depositing a data metal layer on the substrate on which the active pattern is formed and patterning the data metal layer;
    forming a protecting layer on the substrate to cover the data line, the source electrode and the drain electrode;
    forming a photoresist pattern and a pixel area on the substrate, the photoresist pattern being formed on the protecting layer;
    overetching the protecting layer using the photoresist pattern as a mask to form an undercut at a lower portion of the photoresist pattern;
    depositing a conductive material on the photoresist pattern and the pixel area to form a conductive layer and a pixel electrode on the substrate, the conductive layer being separated from the pixel electrode;
    applying a stripping composition onto the substrate to strip the photoresist pattern and/or remove the conductive layer formed on the photoresist pattern from the substrate; and
    collecting used stripping composition, the used stripping composition including the conductive layer removed from the substrate and completely dissolved in the used stripping composition.

2. The method of manufacturing a thin film transistor substrate according to claim 1, further comprising cleaning the stripping composition remaining on the substrate.

3. The method of manufacturing a thin film transistor substrate according to claim 1, wherein the used stripping in composition is stored in a storage tank.

4. The method of manufacturing a thin film transistor substrate according to claim 1, wherein the stripping composition comprises a stripping agent for a photoresist layer and a stripping additive for a conductive layer,
    the stripping agent for the photoresist comprising:
    about 20 percent by weight to about 40 percent by weight of an amine-based compound;
    about 20 percents by weight to about 50 percent by weight of a protonated glycol-based compound; and
    about 20 percent by weight to about 40 percent by weight of a deprotonated multipolar compound, and
    the stripping additive for the conductive layer comprising about 0.5 percent by weight to about 3 percent by weight of a thiol-based compound.

5. The method of manufacturing a thin film transistor substrate according to claim 4, wherein the conductive layer is dissolved for about 10 minutes to about 30 minutes.

6. The method of manufacturing a thin film transistor substrate according to claim 4, wherein the pixel electrode and the conductive layer comprise indium zinc oxide (IZO), indium tin oxide (ITO), amorphous indium tin oxide (a-ITO) or any combination including at least one of the foregoing.

7. The method of manufacturing a thin film transistor substrate according to claim 1, wherein the used stripping composition is recycled and continuously used for the manufacturing of subsequent thin film transistor substrate.

8. A method of manufacturing a thin film transistor substrate comprising:
    forming a gate line and a gate electrode on a substrate;
    forming a gate insulating layer and an active layer on the gate line and the gate electrode;
    forming a data metal pattern and an active pattern by using single mask, the data metal pattern including a data line, a source electrode and a drain electrode;
    forming a protecting layer on the substrate to cover the data line, the source electrode and the drain electrode;
    forming a photoresist pattern and a pixel area on the substrate, the photoresist pattern being formed on the protecting layer;
    overetching the protecting layer using the photoresist pattern as a mask to form an undercut at a lower portion of the photoresist pattern;
    depositing a conductive material on the photoresist pattern and the pixel area to form a conductive layer and a pixel electrode on the substrate, the conductive layer being separated from the pixel electrode;
    applying a stripping composition onto the substrate to strip the photoresist pattern and/or remove the conductive layer formed on the photoresist pattern from the substrate; and
    collecting used stripping composition, the used stripping composition including the conductive layer removed from the substrate and completely dissolved in the used stripping composition.

9. The method of manufacturing a thin film transistor substrate according to claim 8, further comprising cleaning the stripping composition remaining on the substrate.

10. The method of manufacturing a thin film transistor substrate according to claim 8, wherein the used stripping in composition is stored in a storage tank.

11. The method of manufacturing a thin film transistor substrate according to claim 8, wherein the stripping composition comprises a stripping agent for a photoresist layer and a stripping additive for a conductive layer,
    the stripping agent for the photoresist comprising:
    about 20 percent by weight to about 40 percent by weight of an amine-based compound;
    about 20 percents by weight to about 50 percent by weight of a protonated glycol-based compound; and
    about 20 percent by weight to about 40 percent by weight of a deprotonated multipolar compound, and
    the stripping additive for the conductive layer comprising about 0.5 percent by weight to about 3 percent by weight of a thiol-based compound.

12. The method of manufacturing a thin film transistor substrate according to claim 11, wherein the conductive layer is dissolved for about 10 minutes to about 30 minutes.

13. The method of manufacturing a thin film transistor substrate according to claim 11, wherein the pixel electrode and the conductive layer comprise indium zinc oxide (IZO), indium tin oxide (ITO), amorphous indium tin oxide (a-ITO) or any combination including at least one of the foregoing.

14. The method of manufacturing a thin film transistor substrate according to claim 8, wherein the used stripping composition is recycled and continuously used for the manufacturing of subsequent thin film transistor substrate.

* * * * *